United States Patent
Furuse et al.

(10) Patent No.: US 7,687,137 B2
(45) Date of Patent: Mar. 30, 2010

(54) INSULATING SUBSTRATE AND MANUFACTURING METHOD THEREFOR, AND MULTILAYER WIRING BOARD AND MANUFACTURING METHOD THEREFOR

(75) Inventors: Tatsuji Furuse, Kirishima (JP); Seiichiro Hirahara, Kirishima (JP); Sentarou Yamamoto, Kirishima (JP); Kouji Yamamoto, Kirishima (JP); Mitsugi Ogawauchi, Kirishima (JP); Satoru Kajihara, Kirishima (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 11/365,028

(22) Filed: Feb. 28, 2006

(65) Prior Publication Data

US 2006/0194032 A1  Aug. 31, 2006

(30) Foreign Application Priority Data

Feb. 28, 2005  (JP)  ............................ P2005-053439
Apr. 5, 2005  (JP)  ............................ P2005-108719

(51) Int. Cl.
*B32B 15/00* (2006.01)

(52) U.S. Cl. ........................ 428/210; 174/258; 428/426; 428/432

(58) Field of Classification Search ................ 428/210, 428/426, 432.21; 174/258
See application file for complete search history.

(56) References Cited

U.S. PATENT DOCUMENTS

| | | | |
|---|---|---|---|
| 4,424,251 A * | 1/1984 | Sugishita et al. ............ 428/209 |
| 4,764,233 A * | 8/1988 | Ogihara et al. ........... 156/89.18 |
| 5,254,191 A | 10/1993 | Mikeska et al. |
| 5,300,163 A * | 4/1994 | Ohtaki .................... 156/89.15 |
| 5,387,474 A | 2/1995 | Mikeska et al. |
| 5,474,741 A | 12/1995 | Mikeska et al. |
| 5,757,611 A * | 5/1998 | Gurkovich et al. ....... 361/321.4 |
| 5,866,240 A * | 2/1999 | Prabhu et al. ............... 428/210 |
| 6,265,090 B1 * | 7/2001 | Nishide et al. ............. 428/701 |
| 6,337,123 B1 * | 1/2002 | Ryugo et al. ................ 428/210 |
| 6,417,461 B1 * | 7/2002 | Hirahara et al. ............ 174/256 |
| 6,426,551 B1 * | 7/2002 | Kawakami et al. .......... 257/700 |
| 6,743,534 B2 * | 6/2004 | Lautzenhiser et al. ....... 428/701 |
| 6,776,861 B2 * | 8/2004 | Wang et al. .............. 156/89.11 |
| 6,797,093 B2 * | 9/2004 | Moriya et al. ............ 156/89.12 |

(Continued)

FOREIGN PATENT DOCUMENTS

JP  04-243978  9/1992

(Continued)

OTHER PUBLICATIONS

Japanese language office action and its partial English language translation for corresponding Japanese application 2003041485 lists the references above.

*Primary Examiner*—Cathy Lam
(74) *Attorney, Agent, or Firm*—Hogan & Hartson LLP (57) ABSTRACT

There is provided a dimensionally accurate insulating substrate in which plane direction-wise shrinkage is practically zero and shrinkage variations are small. The insulating substrate includes a laminated body composed of at least two kinds of insulating layers made of crystallizable glass ceramics. The crystallization temperature of crystallizable glass contained in the first insulating layer is lower than the softening point of crystallizable glass contained in the second insulating layer. The difference in thermal expansion coefficient between the first and second insulating layers is preferably $2 \times 10^{-6}/°$ C. or below.

8 Claims, 3 Drawing Sheets

U.S. PATENT DOCUMENTS

| | | |
|---|---|---|
| 6,897,172 B2 * | 5/2005 | Furuse et al. .................. 501/32 |
| 2002/0189742 A1 | 12/2002 | Moriya et al. |
| 2004/0234072 A1 | 11/2004 | Hirai et al. |

FOREIGN PATENT DOCUMENTS

| | | |
|---|---|---|
| JP | 05327218 A | 12/1993 |
| JP | 06-097656 | 4/1994 |
| JP | 08-236936 | 9/1996 |
| JP | 08236936 A | 9/1996 |
| JP | 2002-261443 | 9/2002 |
| JP | 2002-290037 | 10/2002 |
| JP | 2002-368420 | 12/2002 |
| JP | 2003-069236 | 3/2003 |
| JP | 2003069236 A | 3/2003 |
| JP | 2003342060 A | 12/2003 |

* cited by examiner

INSULATING SUBSTRATE AND MANUFACTURING METHOD THEREFOR, AND MULTILAYER WIRING BOARD AND MANUFACTURING METHOD THEREFOR

BACKGROUND OF THE INVENTION

1. Field of the Invention

The present invention relates to an insulating substrate, which is suitable for use as a circuit board, and a manufacturing method for the insulating substrate, and a multilayer wiring board and a manufacturing method for the multilayer wiring board.

2. Description of the Related Art

While multilayer wiring boards using ceramics as their insulating substrates have conventionally been in wide use, in keeping with the recent demand for multilayer wiring boards provided with various functions, multilayer wiring boards fabricated by the use of a combination of ceramics materials of different types have been proposed to date. For example, there are known a multilayer wiring board that offers high strength by using a combination of a low-strength ceramic insulating layer and a high-strength ceramic insulating layer, and a multilayer wiring board that allows incorporation of a high-capacitance capacitor by using a laminated body composed of low-dielectric constant insulating layers having sandwiched therebetween a high-dielectric constant insulating layer.

In such a multilayer wiring board, to prevent generation of cracks and delamination in ceramics materials, in general, the selection and control of the characteristics of insulating-layer materials are made carefully to make the ceramic insulating layers of different types uniform in terms of firing shrinkage and thermal expansion coefficient.

Moreover, in order to carry out a reduction of costs for manufacturing a multilayer wiring board and enhancement of the dimensional accuracy of an electrode formed on a multilayer wiring board (insulating substrate) or highly accurate mounting of constituent components, it has recently been demanded that the firing shrinkage of an insulating substrate should be reduced in the plane direction (X-Y direction) thereof, and warpage and deformation resulting from shrinking-behavior variations occurring in the course of firing should be suppressed. Unfortunately, multilayer wiring boards of a related art, however, failed to meet such a demand.

In order to satisfy such a requirement, the following methods have been developed in recent years. Namely, on the one hand, in accordance with a so-called pressure-firing technique, an unfired laminated body composed of insulating green sheets (inclusive of a plurality of sheets to be formed into insulating layers of different types) is fired while being pressurized through an $Al_2O_3$ sintered plate so as to increase the degree of firing shrinking in the thickness direction (Z direction) thereof. Thereby, a wiring board having a desired insulating substrate is fabricated. On the other hand, on the surface of a green-sheet laminated body is disposed an unfired ceramic layer which will not be sintered at a temperature at which the laminated body is burned, so that the green-sheet laminated body is arrested by the unfired ceramic layer. Thereby, the shrinking of the laminated body is so controlled that it occurs only in the thickness direction thereof. Afterwards, the unfired ceramic layer is removed (for example, refer to U.S. Pat. No. 2,554,415). In either method, a conductor paste for forming a wiring pattern is applied to the surface of the green sheet, or is charged inside the green sheet. Then, by firing the laminated body, an insulating substrate and a wiring conductor layer can be obtained at the same time (co-firing).

However, these methods have encountered the following problems. Namely, the former adopting the pressure-firing technique necessitates not only a warpage-free $Al_2O_3$ sintered plate but also specially-devised pressurizing means, whereas the latter exploiting the arresting action of the unfired ceramic layer (restrictive firing) necessitates a step for removing the unfired ceramic layer after the firing process is over, which is liable to result in an undesirable increase in the number of manufacturing process steps.

In light of the foregoing, the following circuit board manufacturing method has been proposed to date (for example, refer to Japanese Unexamined Patent Publication JP-A 2002-261443). Namely, in firing a laminated body composed of two kinds of insulating green sheets having different firing shrinking starting temperatures at one time, their firing shrinking starting temperatures are so controlled that, at the point in time when one green sheet having a higher firing shrinking starting temperature begins to shrink, the other green sheet having a lower firing shrinking starting temperature has already arrived at 90% or more of a predetermined final firing volume shrinking amount. This makes it possible to suppress dimensional changes in a resulting circuit board.

In the circuit board manufacturing method disclosed in JP-A 2002-261443, in firing a laminated body composed of two kinds of ceramic moldings having different firing shrinking starting temperatures at one time, it is necessary to control their firing shrinking starting temperatures in such a manner that, at the point in time when one insulating layer having a higher firing shrinking starting temperature begins to shrink, the other insulating layer having a lower firing shrinking starting temperature has already arrived at 90% or more of a predetermined final firing volume shrinking amount. This makes it possible to suppress dimensional changes in a resulting circuit board. However, on the negative side, this method pays heed only to the control of firing shrinking starting temperatures. This could give rise to problems such as occurrence of appreciable shrinking-behavior variations under restriction and a failure of ensuring sufficiently low shrinkage.

According to the manufacturing method disclosed in JP-A 2002-261443, dimensional-change control can be exercised with ease. However, only with this advantage, it is difficult to ensure that the plane direction-wise shrinkage of the substrate becomes practically zero, or undesirable shrinkage variations are inevitable. Furthermore, in forming the green sheet having a higher firing shrinking starting temperature and the green sheet having a lower firing shrinking starting temperature, while the characteristics of the sheet materials can be changed according to purposes, it is necessary to make adjustment to the shrinking behaviors of the sheets individually. This imposes limitations on material design and thus the characteristics of materials cannot be changed greatly. Accordingly, in order to attain improved capability more effectively, another insulating green sheet which is free from shrinking-behavior limitations needs to be prepared for use. Moreover, in a wiring conductor layer obtained by restrictive firing, its plane direction-wise shrinkage is restrained as with the case of the substrate. It is thus inevitable that most of the total necessary firing shrinkage of the wiring conductor layer will be compensated for by the thickness direction-wise shrinkage thereof. As a result, asperities tend to appear at the interface between the wiring conductor layer and the insulating layer, in consequence whereof there results an increased conductor resistance and poor interface conductivity. This leads up to electrical characteristic degradation in a resulting insulator layer with a built-in capacitor or the like function.

Also proposed is the following method (for example, refer to JP-A 2002-290037). Namely, in firing a laminated body composed of two kinds of ceramic moldings having different firing shrinking starting temperatures and a wiring layer at one time, the volume shrinkage and shrinking starting temperature of a conductor layer is so controlled as to prevent cracks and delamination from occurring in the vicinity of the interface of the conductor layer.

However, in recent years, circuit boards have been becoming increasingly lower in profile and yet higher in performance. As a natural consequence of this trend, slimness has been sought after in a ceramic molding for use therein, and correspondingly the volumetric ratio of a conductor layer present in the ceramic molding to the ceramic molding has been increasing. In the end, the ceramic molding and the conductor layer have been prone to vary in firing shrinking behavior, which leads up to appreciable warpage. This problem was taken no notice of in JP-A 2002-261443 and JP-A 2002-290037.

SUMMARY OF THE INVENTION

Accordingly, it is an object of the invention to provide a dimensionally accurate insulating substrate in which plane direction-wise shrinkage is reduced to practically zero and shrinkage variations can be decreased, as well as to provide a method for manufacturing the insulating substrate.

It is another object of the invention to provide a dimensionally accurate multilayer wiring board having excellent electrical characteristics that is fabricated by firing together a plurality of stacked insulating layers that exhibit different firing shrinkage curves (shrinking behaviors) in a manner so as to insure that the insulating layers of different types are inhibited from shrinking in a plane direction by each other, as well as to provide a method for manufacturing the multilayer wiring board.

It is yet another object of the invention to provide a multilayer wiring board that is small in thickness and nevertheless suffer little from warpage.

The invention provides an insulating substrate comprising:

a laminated body including at least two kinds of glass-ceramics insulating layers, wherein a crystallization temperature of crystallizable glass contained in a first insulating layer of the at least two kinds of glass-ceramics insulating layers is lower than a softening point of crystallizable glass contained in a second insulating layer thereof.

According to the invention, the insulating substrate comprises a laminated body composed of at least two kinds of glass-ceramics insulating layers. In this construction, by setting the crystallization temperature of the crystallizable glass contained in the first insulating layer to be lower than the softening point of the crystallizable glass contained in the second insulating layer, it is possible to attain high dimensional accuracy, to ensure that plane direction-wise shrinkage becomes practically zero, and to decrease shrinkage variations.

In the invention, it is preferable that a difference in thermal expansion coefficient between the first insulating layer and the second insulating layer is given by: $2 \times 10^{-6}/°C$. or below.

According to the invention, by setting the difference in thermal expansion coefficient between the first insulating layer and the second insulating layer at $2 \times 10^{-6}/°C$. or below in particular, it is possible to prevent more effectively generation of cracks and delamination in the multilayer board.

In the invention, it is preferable that the first and the second insulating layers each have a crystallizable glass content of 30% by mass or above.

According to the invention, in a case where the first and the second insulating layers each contain crystallizable glass in an amount of 30% by mass or above, still stabler sinterability and adherability can be attained.

In the invention, it is preferable that the first and second insulating layers each have a residual glass content of 10% by volume or below.

It is desirable that each of the first and second insulating layers should have a residual glass content of 10% by volume or below in terms of plane direction (X-Y direction)-wise shrinking restriction effect, substrate strength in bending, and dielectric loss.

In the invention, it is preferable that the crystallizable glass contained in the first and second insulating layers forms at least one selected from the group consisting of diopside, hardestnite, celsian, cordierite, anorthite, gahnite, willemite, spinel, mullite, forsterite and suanite.

According to the invention, in a case where the crystallizable glass contained in the first and second insulating layers forms at least one selected from the group consisting of diopside, hardestnite, celsian, cordierite, anorthite, gahnite, willemite, spinel, mullite, forsterite, and suanite, improved dielectric characteristics or strength can be attained.

The invention provides a multilayer wiring board comprising:

the insulating substrate mentioned above; and wiring layers formed on surfaces of the insulating substrate and in an interior of the insulating substrate, wherein the insulating substrate and the wiring layers are formed by co-firing, and wherein the wiring layer has a cross section whose void ratio is reduced to 5% or below.

According to the invention, in the multilayer wiring board, the ratio of void in the cross section of the wiring layer is kept at 5% or below. In this case, even if the insulating substrate includes at least two kinds of insulating layers having different firing shrinking starting temperatures, the conductor resistance becomes sufficiently low and yet the interface conductivity becomes sufficiently high.

In other words, in the multilayer wiring board of the invention, the proportion of void to the area of the cross section of the wiring layer is as small as 5% or below. Therefore, the insulating layers having different shrinking starting temperatures are allowed to exert an arresting action on each other at their intimate-contact portions in the course of firing. In consequence, even in a case where plane direction (X-Y direction)-wise firing shrinking is restricted, it is possible to decrease the conductor resistance and yet increase the interface conductivity. For example, if the proportion of void to the area of the cross section of the wiring layer exceeds 5%, as has been attested by the experimental example that will be explained later (test sample Nos. 21, 22), the sheet resistance will take on a value as high as 1.6 mΩ/square or above. This causes the electrical characteristics of the multilayer wiring board to deteriorate.

That is, in performing restrictive firing, it is desirable to set the proportion of void to the area of the cross section of the wiring layer at 5% or below. By virtue of such a small void-age, it is possible to make the wiring layer as a whole less defective. Moreover, generation of asperities can be prevented from occurring at the interface between the wiring layer and the insulating layer, wherefore the wiring layer can be formed with high dimensional accuracy, low conductor resistance, and high interface conductivity. Hence, according to the invention, a multilayer wiring board incorporating excellent capability can be realized without the necessity of imposing strict limitations on material design.

In the invention, it is preferable that the wiring layer predominantly contains at least one selected from the group consisting of Au, Ag, Cu, Pd, and Pt.

The invention provides a method for manufacturing an insulating substrate, comprising the steps of:

preparing a laminated body composed of first and second insulating sheets containing crystallizable glass powder and ceramic powder, wherein a crystallization temperature of the crystallizable glass powder contained in the first insulating sheet is lower than a softening point of the crystallizable glass powder contained in the second insulating sheet; and carrying out co-firing of the laminated body to fabricate an insulating substrate.

According to the invention, the first and second insulating sheets can exert shrinking restriction effects on each other with stability. This makes it possible to provide a dimensionally accurate insulating substrate in which firing shrinkage variations can be decreased and the shrinkage can be reduced to practically zero.

In the invention, it is preferable that the first and second insulating sheets each have a crystallizable glass powder content of 30% by mass or above.

In a case where the first and second insulating sheets each have a crystallizable glass powder content of 30% by mass or above in particular, still stabler sinterability and adherability can be attained.

In the invention, it is preferable that the crystallizable glass contained in the first and second insulating sheets forms at least one selected from the group consisting of diopside, hardestnite, celsian, cordierite, anorthite, gahnite, willemite, spinel, mullite, forsterite, and suanite.

In the invention, it is preferable that the crystallizable glass powder contained in the first insulating sheet comprises: 5 to 20% by mass of $SiO_2$; 40 to 50% by mass of MgO; 10 to 30% by mass of $B_2O_3$; and 0 to 30% by mass of at least one selected from the group consisting of CaO, $Al_2O_3$, SrO, ZnO, $TiO_2$, $Na_2O$, BaO, $SnO_2$, $P_2O_5$, $ZrO_2$, and $Li_2O$, whereas the crystallizable glass powder contained in the second insulating sheet comprises: 30 to 50% by mass of $SiO_2$; 10 to 25% by mass of MgO; and 25 to 55% by mass of at least one selected from the group consisting of $B_2O_3$, CaO, $Al_2O_3$, SrO, ZnO, $TiO_2$, $Na_2O$, $SnO_2$, $P_2O_5$, $ZrO_2$, and $Li_2O$.

According to the invention, in a case where the crystallizable glass powder contained in the first and second insulating sheets forms at least one selected from the group consisting of diopside, hardestnite, celsian, cordierite, anorthite, gahnite, willemite, spinel, mullite, forsterite, and suanite, improved dielectric characteristics or strength can be attained.

The invention provides a method for manufacturing a multilayer wiring board comprising the steps of:

preparing a plurality of the first and second insulating sheets mentioned above;

applying a conductor paste in a wiring pattern at least to surfaces of partial insulating sheets among a plurality of the insulating sheets to form a conductor layer, the conductor layer predominantly containing at least one selected from the group consisting of Au, Ag, Cu, Pd, and Pt;

fabricating a laminated body by stacking a plurality of the insulating sheets; and sintering the laminated body.

In the invention, it is preferable that the conductor paste is prepared by blending an organic binder and a solvent into metal powder having a tap bulk density of 15% or above based on a density ($d^{20}$) of a metal element.

According to the invention, in order to adjust the proportion of void to the area of the cross section of the wiring conductor layer to be 5% or below, the wiring conductor layer is formed of a conductor paste prepared by blending suitable organic binder and solvent into metal powder having a tap bulk density of 15% or above based on the density of the metal element.

In the invention, it is preferable that the second insulating sheet has a firing shrinking starting temperature $T_2$ which is higher than both a shrinking ending temperature $T_3$ of the first insulating sheet and a shrinking ending temperature $T_4$ of the conductor layer.

In the invention, it is preferable that $B_1/B_2$ is 0.90 or above, in which $B_1$ represents a volume content of the inorganic compound composed of the crystallizable glass powder and the ceramic powder contained in the first insulating sheet, and $B_2$ represents a volume content of the inorganic compound composed of the crystallizable glass powder and the ceramic powder contained in the second insulating sheet.

In the invention, it is preferable that $B_3/B_2$ is 0.90 or above, in which $B_3$ represents a volume content of the metal compound contained in the conductor layer.

The invention has been devised based on the knowledge that, when the firing shrinking ending temperature of the second insulating sheet and the firing shrinking ending temperature of the conductor layer are lower than the shrinking starting temperature of the first insulating sheet, it is possible to reduce the plane direction (X-Y direction)-wise firing shrinking of the multilayer wiring board to a minimum and thereby minimize warpage occurring in the multilayer wiring board.

Specifically, during the time interval between starting and ending of firing shrinking in the second insulating sheet and the conductor green sheet, X-Y direction-wise firing shrinking is satisfactorily restricted by the other ceramic green sheet in a non-shrinking state. Then, by the time the first insulating sheet begins to shrink, the firing shrinking of the second insulating sheet and the conductor green sheet is over, and thus they in turn act to restrict X-Y direction-wise firing shrinking satisfactorily.

BRIEF DESCRIPTION OF THE DRAWINGS

Other and further objects, features, and advantages of the invention will be more explicit from the following detailed description taken with reference to the drawings wherein.

DETAILED DESCRIPTION OF THE PREFERRED EMBODIMENTS

Now referring to the drawings, preferred embodiments of the invention are described below.

First Embodiment

Figure 1:
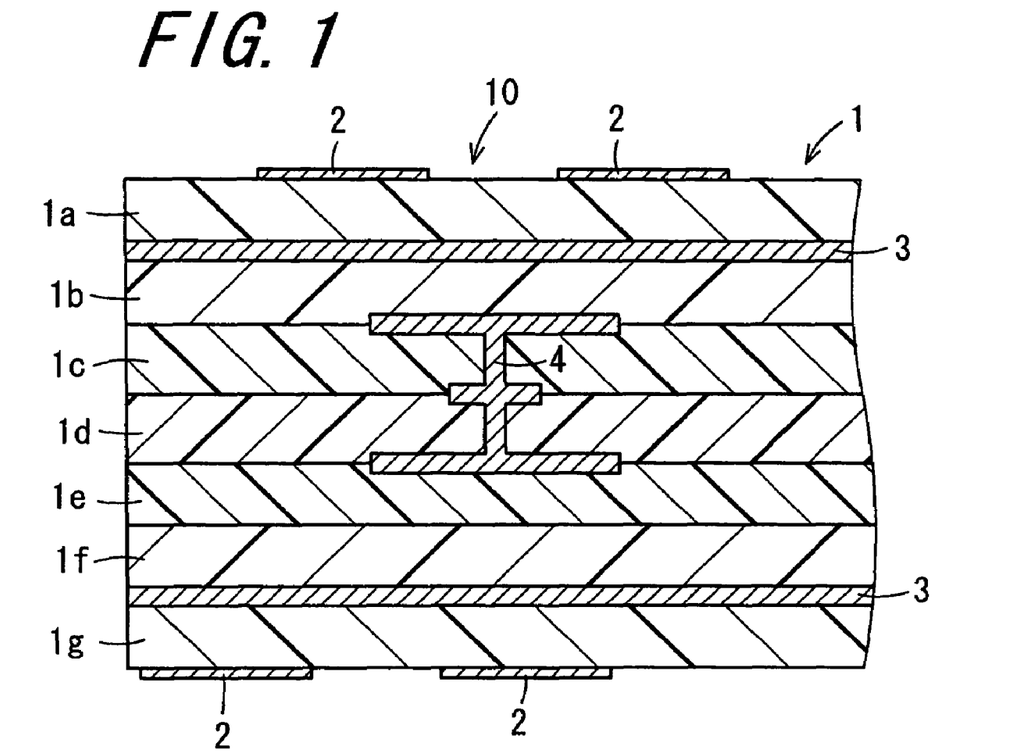
FIG. 1 is a schematic sectional view showing a multilayer wiring board according to a first embodiment of the invention.

FIG. 1 is a schematic sectional view showing a multilayer wiring board according to a first embodiment of the invention. In FIG. 1, the multilayer wiring board 10 is composed of: an insulating substrate 1 composed of a laminated body constituted by stacking together insulating layers 1a through 1g; surface conductor layers 2 formed on the top and back surfaces of the insulating substrate 1; inner conductor layers 3 formed within the insulating substrate 1; and a via-hole conductor 4 for providing connection among the conductor layers.

In more detail, in the multilayer wiring board 10 of the invention having such a constitution, the insulating substrate 1 is formed by stacking a plurality of insulating layers 1a through 1g on top of one another thereby to assume a lamination structure. The inner conductor layer 3 is interposed between the adjacent insulating layers. The via-hole conductor 4 is so formed as to extend penetratingly through at least one of the insulating layers.

The insulating substrate 1 is composed of first and second insulating layers made of glass ceramics materials having different shrinking starting temperatures. In the multilayer wiring board 10 shown in FIG. 1, of the insulating layers 1a through 1g, for example, the insulating layers 1a and 1g may be defined as the first insulating layer, whereas the insulating layers 1b through 1f may be defined as the second insulating layer. The crystallization temperature of crystallizable glass contained in the first insulating layer is lower than the softening point of crystallizable glass contained in the second insulating layer.

In more detail, in the invention, the insulating layers 1a through 1g constituting the insulating substrate 1 are classified at least under two groups according to their firing shrinking starting temperatures. For example, the insulating layers 1a, 1g located on the top and back surfaces of the insulating substrate 1 are made of the same material, and thus have the same firing shrinking starting temperature. The insulating layers 1a and 1g belong to a "first insulating layer" group. On the other hand, the insulating layers 1b through 1f located inside the insulating substrate 1 are made of a material which is different from that used for the first insulating layer, and thus have a firing shrinking starting temperature which is different from that of the first insulating layer. The insulating layers 1b through 1f belong to a "second insulating layer" group.

The classification of the insulating layers 1a through 1g into a plurality of groups is necessary to prevent the warpage and improve the dimensional accuracy by suppressing the shrinkage in the X-Y direction in firing the multilayer wiring board 10 (insulating substrate 1). More specifically, referring to FIG. 1, by employing materials having a high shrinking starting temperature for formation of the insulating layers 1b through 1f located inside the insulating substrate 1, and material shaving a low shrinking starting temperature for formation of the surface insulating layers 1a, 1g, it is made possible to inhibit the mutual shrinkage of the insulating layers on interfaces between different materials when these insulating layers are co-fired.

Although the above description deals with the case where the insulating layers 1a through 1g are classified under two groups: the first insulating layer group and the second insulating layer group, the invention is not limited thereto as a matter of course. Depending upon what kind of capability the insulating substrate is given interiorly, the insulating layers 1a through 1g may be classified under three or more groups according to physical properties such as relative permittivity, bending strength, dielectric loss, thermal conductivity, volume density, and temperature coefficient. For example, in the example shown in FIG. 1, the insulating layers 1c and 1d located in the middle of the insulating substrate may be defined as a third insulating layer, so long as they are made of another material which differs in sintering starting temperature from the materials constituting the first and second insulating layers (a material such as that which has a still higher dielectric constant, for instance). Also in this case, it is possible to impart a capacitor capability to the interior of the insulating substrate. The way of classifying the insulating layers 1a through 1g under the first, second and third (or more) insulating layer groups is determined appropriately in consideration of a target capability to be incorporated.

Now, a description will be given below as to the thermal characteristics of the crystallizable glass materials contained in the first insulating layer 1a, 1g and the second insulating layer 1b through 1f.

It is preferable that the insulating layers 1a through 1g are each made of glass ceramics containing crystallizable glass from the viewpoint of inhibiting plane direction-wise shrinking. For example, the selection of glass ceramic materials for forming the insulating layers 1a through 1g is made in a manner so as to ensure that the crystallization temperature of glass to be contained in the first insulating layer (the insulating layers 1a, 1g) is lower than the softening point of glass to be contained in the second insulating layer (the insulating layers 1b through 1f). This helps reduce plane direction-wise shrinking to practically zero. Given that the crystallization temperature of the glass contained in the first insulating layer (1a, 1g) is lower than the softening point of the glass contained in the second insulating layer (1b through 1f), since the first insulating layer begins to shrink at a relatively low temperature, it follows that, during firing, at the point in time when the second insulating layer (1b through 1f) begins to shrink, the firing shrinking of the first insulating layer (1a, 1g) is nearly over, specifically, for example, the first insulating layer (1a, 1g) has already arrived at 97% or above, especially 98% or above, more especially 99% or above, of a predetermined final firing volume shrinking amount. This means that the second insulating layer is inhibited from shrinking during the interval when the first insulating layer is shrinking, whereas the first insulating layer is inhibited from shrinking during the interval when the second insulating layer is shrinking. As a result, the plane direction (X-Y direction)-wise shrinking of the first insulating layer and the plane direction (X-Y direction)-wise shrinking of the second insulating layer are mutually inhibited, whereby making it possible to reduce the shrinking to nearly zero while decreasing undesirable shrinkage variations.

In the invention, in order to achieve the above-described mutual plane direction-wise shrinking inhibition more effectively, it is desirable that the crystallization temperature of the glass contained in the first insulating layer (1a, 1g) should be 10° C. or more lower than the softening point of the glass contained in the second insulating layer (1b through 1f). Note that, in a case where the insulating layers 1a through 1g are classified under three (or more) insulating layer groups, from a delamination or warpage standpoint, the selection of materials for forming the insulating layers belonging to the third insulating layer group (and the ones belonging to another group/groups) is preferably made in a manner so as to ensure that these insulating layers are similar in shrinking behavior to one of the first and second insulating layers.

As the glass material of the insulating layers 1a through 1g, it is desirable to use crystallizable glass which is capable of precipitating, at the time of firing, at least one selected from the group consisting of diopside, hardestnite, celsian, cordierite, anorthite, gahnite, willemite, spinel, mullite, forsterite, and suanite. In a case where the insulating layers 1a through 1g assume such a crystalline phase as mentioned just above, enhancement of characteristics, for example an excellent dielectric characteristic and high mechanical strength can be achieved. From a dielectric characteristic standpoint, crystallizable glass which is capable of precipitating diopside, hardestnite, celsian, willemite, or forsterite is particularly desirable. From a strength standpoint, crystallizable glass which is capable of precipitating diopside, celsian, cordierite, or anorthite is particularly desirable. With consideration given to both a dielectric characteristic and strength, crystallizable glass which is capable of precipitating diopside or celsian is particularly desirable.

Moreover, in the invention, given that the insulating layers $1a$ through $1g$ for constituting the insulating substrate 1 are classified under at least two groups that are different from each other in terms of material, the selection of materials is preferably made in a manner so as to ensure that the difference in thermal expansion coefficient (in a range of from ambient temperature to 900° C.) between the first insulating layer and the second insulating layer is not greater than $2\times10^{-6}$/° C., especially $1\times10^{-6}$/° C. If the thermal expansion coefficient difference exceeds $2\times10^{-6}$/° C., as the highest firing temperature grows colder and colder, a difference in thermal shrinkage arises, in consequence whereof there results generation of cracks and delamination at the interface between the first and second insulating layers. By setting the thermal expansion coefficient difference to be $2\times10^{-6}$/° C. or lower, it is possible to prevent generation of cracks and delamination that is ascribable to a thermal expansion (thermal shrinkage) difference effectively in the course of cooling subsequent to firing.

The above-described difference in thermal expansion coefficient between the layers can be controlled in the following manner. Namely, in addition to the crystallizable glass constituent, a filler constituent is contained in the insulating layers $1a$ through $1g$, and then the amounts of the constituents are adjusted properly to serve the purpose.

The specific examples of ceramics serving as the filler contained in the first and second insulating layers include: $Al_2O_3$; $SiO_2$; $MgTiO_3$; $CaZrO_3$; $CaTiO_3$; $Mg_2SiO_4$; $BaTi_4O_9$; $ZrTiO_4$; $SrTiO_3$; $BaTiO_3$; $TiO_2$; AlN; and SiN. Among them, $Al_2O_3$, $MgTiO_3$, $CaZrO_3$, $CaTiO_3$, $Mg_2SiO_4$, and $BaTi_4O_9$ are particularly desirable from a dielectric characteristic standpoint; $Al_2O_3$, AlN, and SiN are particularly desirable from a strength standpoint; and $Al_2O_3$ is particularly desirable from the standpoint of both a dielectric characteristic and strength.

As for the above-described crystallizable glass and filler constituents, in the invention, with consideration given to sinterability and adherability between the layers, it is preferable that the insulating layers $1a$ through $1g$ each have a crystallizable glass content of 30% by mass or above, especially 40 to 90% by mass, and more especially 50 to 80% by mass. This means that the content of the filler is 70% by mass or below. In a case where the content of the crystallizable glass is equal to or greater than 30% by mass, the proportion of the glass in the insulating layer is high enough to exploit the viscous flowability of the glass, which results in an advantage in attaining stable sinterability and adherability.

According to the invention, it is preferable that the first and second insulating layers each have a crystallizable glass content of 30% by mass or above, especially 40 to 90% by mass, and more especially 50 to 80% by mass. It is also preferable that the first and second insulating layers each have a residual crystallizable glass content of 10% by volume or below, especially 5% by volume or below, and more especially 2% by volume or below in terms of X-Y direction-wise shrinking restriction effect, substrate strength in bending, and dielectric loss. Note that the amount of the glass remaining maybe determined by the Rietvelt analyzing method using an XRD diffraction pattern. In order to determine a fixed amount of the glass, a specimen substance and ZnO (standard test sample) are admixed in a predetermined ratio, and a programmed data on all of the crystalline phases that will appear in the specimen substance and the standard test sample ZnO is analyzed.

As stated hereinabove, the insulating layers $1a$ through $1g$ for constituting the insulating substrate 1 to be included in the multilayer wiring board 10 of the invention can be formed of a glass ceramics material composed of crystallizable glass and ceramics. Accordingly, a firing process can be achieved at a temperature of 1000° C. or below. This makes it possible to use a low-resistance conductor element, such as Cu, Ag, and Al, to form a wiring layer. Moreover, by virtue of the advantage of providing a lower dielectric constant, the invention is suitable for high-speed transmission. Thus, according to the invention, a multilayer wiring board which is excellent in dimensional accuracy can be produced with high reproducibility.

Note that the first and second insulating layers can be materially designed according to purposes. For example, the material characteristics such as relative permittivity, bending strength, dielectric loss, thermal conductivity, bulk density, and temperature coefficient can be changed on an as needed basis.

Moreover, in FIG. 1, the first insulating layers (A) and the second insulating layers (B) are arranged in the lamination order of ABBBBBA. However, the invention is not limited thereto. For example, the lamination order may be any of ABABABA, AAABAAA, AABBBAA, AABABAA, AABBAAA, ABAAAAA, ABAAABA, ABBABBA, AABAAAA, ABBAAAA, ABBBAAA, and ABBBBAA. Otherwise, in these lamination orders, A and B may be arranged in the place of each other.

Incidentally, as stated just above, in the case of using various kinds of materials having different sintering starting temperatures for forming the insulating layers $1a$ through $1g$, when the insulating layers $1a$ through $1g$ areco-fired, problems may arise with the production of the multilayer wiring board 10. For example, the first insulating layer and the second insulating layer exhibit different firing shrinking behaviors. This leads to poor dimensional accuracy and the risk of damage such as a crack inside the insulating substrate 1. Furthermore, the wiring layers (the surface conductor layer 2, the inner conductor layer 3, and the via-hole conductor 4) cannot be disposed on the surface and in the interior of the insulating substrate 1 with high accuracy, which makes fine wiring or the like process difficult. In view of the foregoing, in the invention, the wiring layers, namely the surface conductor layer 2, the inner conductor layer 3, and the via-hole conductor 4 are so designed that the ratio of void is kept as low as 5% or below, especially 2.5% or below, when viewed in cross section.

In other words, in the invention, by virtue of a low void ratio in the cross section of the wiring layer, the first and second insulating layers having different shrinking starting temperatures exert an arresting action on each other at their intimate-contact portions in the course of firing. As a result, in a case where firing shrinking is restricted in the plane direction (X-Y direction), it is possible to decrease plane direction-wise shrinkage and thus shrinkage variations. Moreover, since the void ratio is kept as low as possible, it follows that the conductor resistance can be decreased and yet the interface conductivity can be increased in the wiring layers (the surface conductor layer 2, the inner conductor layer 3, and the via-hole conductor 4). This makes it possible to enhance the capability incorporated in the multilayer wiring board 10.

Next, a multilayer wiring board manufacturing method of the invention will be explained in detail.

At the outset, powder of raw materials for forming the first and second sheets, specifically, crystallizable glass powder and ceramic powder serving as filler are prepared for use. In other words, in order to obtain ceramic green sheets to be formed into the insulating layers 1a through 1g, the crystallizable glass in powder form and the filler are mixed together at the above-described mixture ratio. In preparing such a powder admixture, as has already been explained, the selection of the crystallizable glass used to form the green sheet to be formed into the first insulating layer (1a, 1g) is preferably made in a manner so as to ensure that the crystallization temperature $T_c$ of the crystallizable glass is lower than (especially, 10° C. or more lower than) the softening point $T_g$ of the glass to be contained in the second insulating layer (1b through 1f). As the crystallizable glass powder, it is desirable to use a substance which is capable of precipitating at least one selected from the group consisting of diopside, hardestnite, celsian, cordierite, anorthite, gahnite, willemite, spinel, mullite, forsterite, and suanite, in the wake of firing from the standpoint of dielectric characteristics or strength.

On the other hand, as the ceramic powder, it is desirable to use at least one selected from the group consisting of $Al_2O_3$ powder; $SiO_2$ powder; $MgTiO_3$ powder; $CaZrO_3$ powder; $CaTiO_3$ powder; $Mg_2SiO_4$ powder; $BaTi_4O_9$ powder; $ZrTiO_4$ powder; $SrTiO_3$ powder; $BaTiO_3$ powder; $TiO_2$ powder; AlN powder; and $Si_3N_4$ powder, from the standpoint of dielectric characteristics or strength.

Here, it is preferable that the first and second insulating sheets each have a crystallizable glass powder content of 30% by mass or above, especially 40 to 90% by mass, and more especially 50 to 80% by mass, from the standpoint of sinterability.

In more detail, it is preferable that the crystallizable glass powder contained in the first insulating sheet comprises: 5 to 20% by mass of $SiO_2$; 40 to 50% by mass of MgO; 10 to 30% by mass of $B_2O_3$; and 0 to 30% by mass of at least one selected from the group consisting of CaO, $Al_2O_3$, SrO, ZnO, $TiO_2$, $Na_2O$, BaO, $SnO_2$, $P_2O_5$, $ZrO_2$, and $Li_2O$. It is preferable that the crystallizable glass powder contained in the second insulating sheet comprises: 30 to 50% by mass of $SiO_2$; 10 to 25% by mass of MgO; and 25 to 55% by mass of at least one selected from the group consisting of $B_2O_3$, CaO, $Al_2O_3$, SrO, ZnO, $TiO_2$, $Na_2O$, $SnO_2$, $P_2O_5$, $ZrO_2$, and $Li_2O$.

Subsequently, with use of these powder materials, green sheets are formed as the first and second insulating sheets in the following manner. Firstly, a predetermined ceramic powder compound is mixed with a volatile organic binder which is caused to volatilize easily in the course of firing and an organic solvent, and, if necessary, a plasticizer, to form a slurry. The slurry is formed into a tape-like molding by a known technique such as the lip coater method or the doctor blade method, and the molding is then cut up to obtain green sheets of predetermined dimension. Note that, in some cases, one of the insulating layers may be made in the form of a paste.

In other words, the selection of the crystallizable glass used to form the green sheet to be formed into the first insulating layer (1a, 1g) is preferably made so as to ensure that the crystallization temperature $T_c$ of the crystallizable glass is lower than (especially, 10° C. or more lower than) the softening point $T_g$ of the glass to be contained in the second insulating layer (1b through 1f). Based on this condition, various changes are made to the composition (the kind and/or amount of the crystallizable glass and/or filler) of the powder admixture. The powder admixtures of varying types thus obtained are each added with a volatile binder which is caused to volatilize in the course of firing (for example, ethylcellulose or acrylic resin), a solvent (for example, alcohol-base solvent such as isopropyl alcohol), and, if necessary, a plasticizer, to form a molding slurry or paste. The slurry (or paste) is molded into green sheets by a known molding technique such as the lip coater method or doctor blade method, whereupon the green sheets for constituting the first insulating layer (1a, 1g) and the second insulating layer (1b through 1f) are prepared for use.

In the green sheets thus formed, depending upon which insulating layer is acquired, the surface conductor layer 2, the inner conductor layer 3, or the via-hole conductor 4 needs to be formed with use of a conductor paste. Specifically, the conductor paste is applied in conformity with the predetermined patterns of the surface conductor layer 2 and the inner conductor layer 3 by means of screen printing or the like method, or is charged in a through hole drilled by punching or the like process at a position corresponding to the via-hole conductor 4.

In order to obtain the conductor paste, powder of a metal material (for example, a low-resistance element such as Cu, Ag, and Al) suitable for forming the surface conductor layer 2, the inner conductor layer 3, and the via-hole conductor 4 (they will collectively be referred to simply as "wiring layer") is prepared first. Then, just as in the case of forming the green sheets for constituting the insulating layers, suitable organic binder and organic solvent are blended into the metal powder. Note that, in the invention, it is essential to use metal powder having a tap bulk density of the order of 15% or above, especially 35% or above, based on the density ($d^{20}$) of the metal element (according to the density measurement method prescribed in JIS R1628). The use of the metal powder having undergone substantial tap-bulk-density adjustment makes it possible to ensure that the ratio of void in the cross section of the wiring layer is kept at 5% or below, especially 2.5% or below. In this way, the insulating layers make intimate contact with one another, wherefore, as stated previously, the first and second insulating layers exert an arresting action on each other satisfactorily in the course of firing. This makes it possible to lessen firing shrinking, to avoid shrinkage variations, and to decrease the conductor resistance and thus enhance the interface conductivity in the wiring layer.

In other words, the metal powder employed in the invention possesses a considerably high tap bulk density. By using such a metal powder material with highly dense metal powder particles in which little void is present between the particles, it is possible to keep the ratio of void in the wiring layer as low as 5% or below, especially 2.5% or below, when viewed in cross section.

In order to increase the tap bulk density of the metal powder to the aforementioned level, a large number of fine-grain particles are contained therein, and then the metal powder is subjected to agitation in a ball mill. In some cases, a pressurization treatment is carried out under reduced pressure. It is also effective to use flat-shaped powder particles to increase the tap bulk density.

Alternatively, as the metal powder, an admixture of powder materials of two or more kinds is usable. In this case, the metal-element density ($d^{20}$) of the powder admixture can be calculated by adding together the densities ($d^{20}$) of the individual metal elements contained in the powder admixture on the basis of the mass ratio between the metal elements, and thereby the ratio of the tap bulk density to the metal-element density can be obtained by calculation. The above-described way of calculation is also true for the case where the metal powder particle has its surface coated with glass, oxide, or the like substance to exercise shrinking-behavior control.

In general, it is preferable that the conductor paste has a metal powder content of 80% by mass or above, especially, 85% by mass or above. If the metal powder content is unduly low, the gap between the particles will be increased in size due to entrained air or the flowing action of the conductor paste accompanied by application, which leads to an undesirable increase in the ratio of void in the cross section of the wiring conductor layer.

The green sheets to be formed into the first insulating layer (1a, 1g) and the second insulating layer (1b through 1f) thus obtained are subjected to compression bonding to form a laminated body. The laminated body is, after undergoing a binder removal treatment, fired at a higher temperature than before, whereupon the multilayer wiring board 10 of the invention is constructed.

In general, a firing process is performed at a temperature of 1000° C. or below, especially within a range of from 850 to 950° C. However, as stated above, the ratio of void in the conductor paste used to form the wiring layer is significantly reduced, thereby ensuring tight adherence between the first insulating layer (1a, 1g) and the second insulating layer (1b through 1f) at the interface therebetween. Therefore, the first and second insulating layers exert a satisfactory arresting action on each other at the interface. As a result, the following advantages are gained: the difference in firing shrinking between the first and second insulating layers can be decreased; the plane direction-wise shrinkage can be inhibited; and shrinkage variations can be reduced.

Moreover, in the invention, in the green sheets formed in the above stated manner, given that the shrinking ending temperature of the green sheet to be formed into the first insulating layer is $T_3$ and that the shrinking starting temperature of the green sheet to be formed into the second insulating layer is $T_2$, then, from the fact that the crystallization temperature Tc of the crystallizable glass contained in the first insulating layer (1a, 1g) is lower than the softening point Tg of the crystallizable glass contained in the second insulating layer (1b through 1f), the following relationship holds. Note that the temperatures $T_3$, $T_2$, etc. can be measured by means of TMA (Thermo Mechanical Analysis) or DTA (Differential Thermal Analysis).

$$T_3<Tc<Tg<T_2$$

As will be understood from the above expression representing the temperature relationship, the green sheet to be formed into the second insulating layer (1b through 1f) is kept in a non-shrinking state during the interval when the green sheet to be formed into the first insulating layer (1a, 1g) is shrinking. Accordingly, the green sheet to be formed into the second insulating layer in a non-running state acts to inhibit the plane direction-wise shrinking of the green sheet to be formed into the first insulating layer. On the other hand, at the point in time when the green sheet to be formed into the second insulating layer begins to shrink in the course of sintering, the shrinking of the green sheet to be formed into the first insulating layer is nearly over. Accordingly, the green sheet to be formed into the first insulating layer in a non-running state acts to inhibit the plane direction-wise shrinking of the green sheet to be formed into the second insulating layer. As a result, the plane direction-wise firing shrinking of the substrate as a whole obtained after firing can be restricted even further. Moreover, since the crystallization temperature of the glass contained in the green sheet to be formed into the first insulating layer is lower than the softening point of the glass powder contained in the green sheet to be formed into the second insulating layer, it follows that, at the point in time when the green sheet to be formed into the second insulating layer begins to shrink, the shrinking of the green sheet to be formed into the first insulating layer is nearly over and thus it is brought into a crystallized state. This makes it possible to provide a multilayer wiring board in which shrinkage variations are decreased, the shrinkage is reduced to practically zero, and high dimensional accuracy is attained.

After all, a final firing process is performed at a temperature which is higher than the shrinking starting temperature $T_2$ of the green sheet to be formed into the second insulating layer (1b through 1f). In this regard, the so-called multi-step firing process may be adopted. Namely, for example, in the first firing step, the firing temperature is adjusted to fall in between the shrinking ending temperature $T_1$ of the sheet to be formed into the first insulating layer and the crystallization temperature Tc of the glass powder contained in the sheet to be formed into the first insulating layer, and, in the next firing step, the firing temperature is changed to be higher than the shrinking starting temperature $T_2$. This makes it possible achieve mutual shrinking inhibition between the first insulating layer-sheet and the second insulating layer-sheet more effectively.

Second Embodiment

Figure 2:
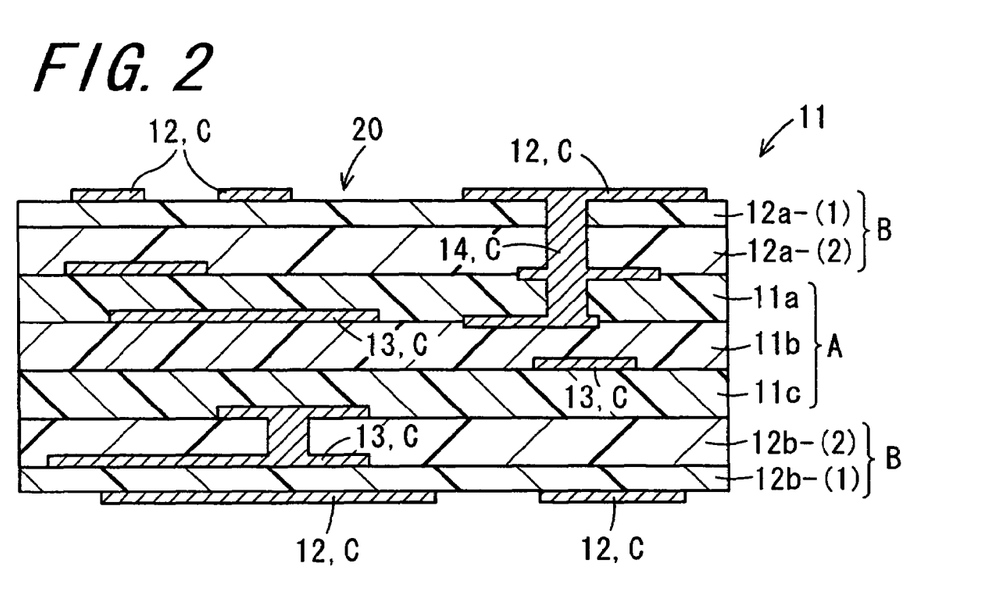
FIG. 2 is a schematic sectional view showing a multilayer wiring board according to a second embodiment of the invention.

FIG. 2 is a schematic-sectional view showing a multilayer wiring board according to a second embodiment of the invention. In FIG. 2, the multilayer wiring board 2 is composed of: an insulating substrate 11 constituted by stacking together second insulating sheets 11a through 11c which are ceramic green sheets and combined layers 12a and 12b; surface conductor layers 12 formed on the top and back surfaces of the insulating substrate 11; inner conductor layers 13 formed within the insulating substrate 11; and a via-hole conductor 14 for providing connection among the conductor layers.

The combined layers for constituting the insulating substrate 11 are composed of first and second insulating sheets which are ceramic green sheets having different shrinking starting temperatures. Specifically, the firing shrinking starting temperature of the insulating sheets 12a-(1), 12b-(1) is lower than those of the other insulating sheets 12a-(2), 12b-(2), and 11a through 11c. Meanwhile, the firing shrinking ending temperature of the insulating sheets 12a-(1), 12b-(1) is lower than the firing shrinking starting temperatures of the insulating sheets 12a-(2), 12b-(2), and 11a through 11c. Moreover, the firing shrinking ending temperature of the conductor green sheet used to form the surface conductor layer 12 and the inner conductor layer 13 is lower than those of the insulating sheets 12a-(2), 12b-(2), and 11a through 11c.

Figure 3:
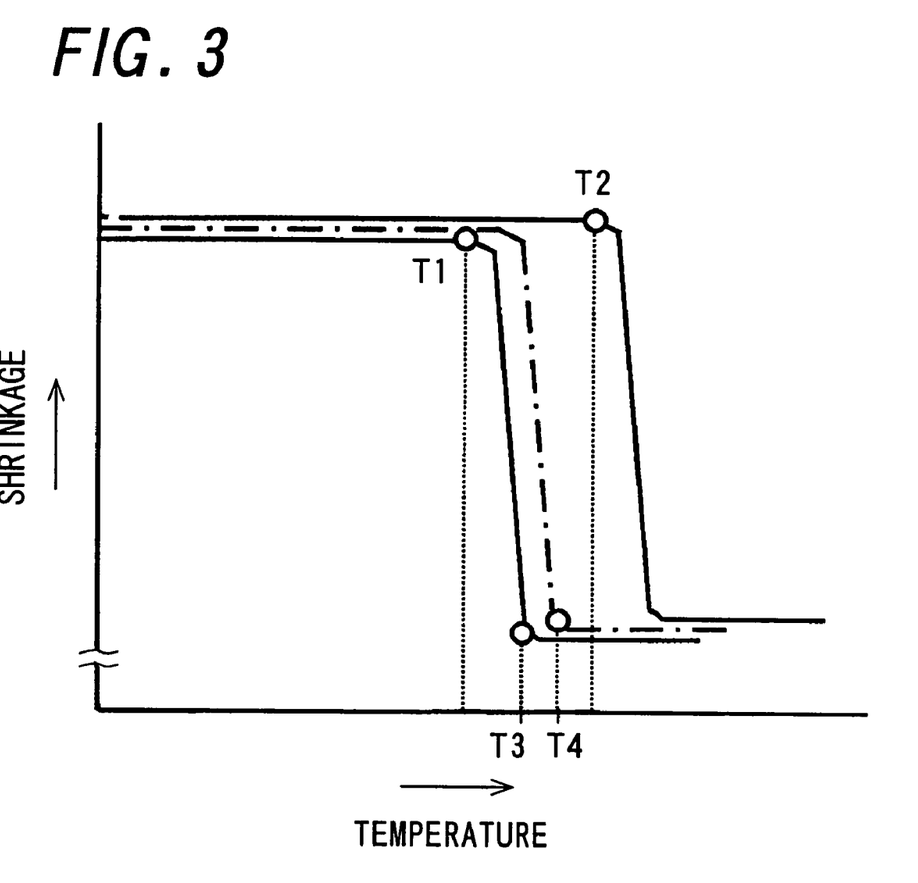
FIG. 3 is a view of assistance in explaining shrinking behaviors as observed in the multilayer wiring board shown in FIG. 2.

Now, a description will be given as to the outline of the firing shrinking behaviors of the two types of ceramic green sheets and the conductor green sheet with reference to FIG. 3 showing firing shrinkage curves. According to FIG. 3, in the invention, what is essential is that, given that the two first and second insulating sheets of different firing shrinking starting temperatures have firing shrinking starting temperatures $T_1$ and $T_2$, respectively, then the relationship between $T_1$ and $T_2$ is given by: $T_1<T_2$, and that, given that the first insulating sheet and the conductor green sheet have firing shrinking ending temperatures $T_3$ and $T_4$, respectively, then the relationship among $T_3$, $T_4$, and $T_2$ is given by: $T_3<T2$, and $T_4<T_2$.

In the multilayer wiring board shown in FIG. 2, for example, in the insulating substrate 11, the insulating sheets 12a-(1) and 12b-(1) correspond to the first insulating sheet, the insulating sheets 12a-(2), 12b-(2), and 11a through 11c correspond to the second insulating sheet, and the surface conductor layer 2 and the inner conductor layer 3 correspond to the conductor green sheet C which is a conductor layer.

According to the invention, what is essential is that, at the point in time when the second insulating sheet having a highest firing shrinking starting temperature begins to shrink in the course of firing, the firing shrinking of the first insulating sheet and the conductor green sheet C should be over.

If the first insulating sheet and the conductor green sheet C are still in a firing shrinking state when the second insulating sheet having a highest firing shrinking starting temperature begins to shrink, the first insulating sheet, the second insulating sheet, and the conductor green sheet C will fail to exert a satisfactory arresting action on one another during the firing shrinking, in consequence whereof there results generation of warpage due to unevenness in firing shrinking behavior.

Moreover, it is preferable that the difference between the shrinking starting temperature $T_2$ of the second insulating sheet and the shrinking ending temperature $T_3$, $T_4$ of the first insulating sheet, the conductor green sheet C ($T_2$-$T_3$, $T_2$-$T_3$) is set to be 10° C. or above, especially 20° C. or above.

This is because, the smaller the temperature range in which the firing shrinking actions of the different insulating sheet groups overlap with each other, the greater the mutual shrinking inhibition effects. Note that the firing shrinking ending temperature refers to a temperature at which the firing shrinking of a sheet arrives at 99% of a predetermined final firing volume shrinking amount.

According to the invention, as the ceramic material of the insulating substrate 11, any of an insulating substance, a dielectric substance, and a magnetic substance is usable. Moreover, in selecting at least two kinds of ceramic materials having different firing shrinking starting temperatures, it is possible to use the ones having different compositions, or the ones having an identical composition but having different ceramic particle distributions or different specific surface areas.

The point of difference between the ceramic materials of two or more kinds is not limited to in firing shrinking starting temperature. For example, the ceramic materials are permitted to have different relative permittivity, different strength, and different dielectric loss characteristics according to objects.

Moreover, it is preferable that the ceramic material for use is firable together with the low-resistance conductor layer. In light of this, it is desirable to use a ceramic material which is firable at a temperature as low as 1050° C. or below, or in particular a ceramic material which is capable of co-firing with Ag at a temperature of 960° C. or below, especially 920° C. or below, because Ag is firable in the surrounding atmosphere. The known examples of such a low temperature-firable ceramic material include: a glass powder-base material; a glass-ceramic admixture powder-base material; and an oxide-containing admixture powder-base material.

As the glass element, any of amorphous glass and crystallizable glass is usable. For example, the ceramic material should preferably comprise 50 to 100 parts by weight of glass powder to 0 to 50 parts by weight of ceramic powder. Although there is no particular limitation, for example, the glass powder should preferably have a composition of 20 to 70 parts by weight of $SiO_2$, 0.5 to 30 parts by weight of $Al_2O_3$, and 3 to 60 parts by weight of MgO, and further, on an as needed basis, 0 to 35 parts by weight of CaO, 0 to 30 parts by weight of BaO, 0 to 30 parts by weight of SrO, 0 to 20 parts by weight of $B_2O_3$, 0 to 30 parts by weight of ZnO, 0 to 10 parts by weight of $TiO_2$, 0 to 3 parts by weight of $Na_2O$, and 0 to 5 parts by weight of $Li_2O$.

As the ceramic powder, at least one or more selected from the group consisting of $Al_2O_3$; $SiO_2$; $MgTiO_3$; $CaZrO_3$; $CaTiO_3$; $Mg_2SiO_4$; $BaTi_4O_9$; $ZrTiO_4$; $SrTiO_3$; $BaTiO_3$; and $TiO_2$ can be used.

The use of such a combination of glass powder and ceramic powder having the above-described composition makes it possible to achieve sintering at a temperature as low as 1000° C. or below, as well as to use a low-resistance conductor element such as Cu, Ag, and Au for constituting the conductor layer. Moreover, by virtue of the advantage of providing a lower dielectric constant, the invention is suitable for high-speed transmission. Further, various changes can be made to the powder composition so long as the above-described conditions are fulfilled. This helps facilitate control and change to firing shrinking behaviors.

According to the invention, the laminated body needs to be so designed that, at the point in time when the second insulating sheet having a highest firing shrinking starting temperature begins to shrink in the course of firing, the firing shrinking of the first insulating sheet and the conductor green sheet C is over. As stated above, such a laminated body can be realized by making changes to the composition of the insulating sheet or by making changes to the grain size of the metal powder contained in the conductor green sheet properly, for example. However, the best way is to set the volume content (%) of each of the inorganic and metal compounds contained in the green sheets to be formed into the ceramic A, the ceramic B, and the conductor layer C at an appropriate value.

To be more specific, given that the volume content of the first inorganic compound contained in the first insulating sheet is $B_1$, and the volume content of the second inorganic compound contained in the second insulating sheet is $B_2$, then $B_1/B_2$ is preferably set at 0.90 or above, especially 0.95 or above. In other words, $B_1/B_2$ is preferably 0.90 or above, especially 0.95 or above, in which $B_1$ represents a volume content of the inorganic compound composed of the crystallizable glass powder and the ceramic powder contained in the first insulating sheets 11a and 11b, 12a-(2), 12b-(1) and $B_2$ represents a volume content of the inorganic compound composed of the crystallizable glass powder and the ceramic powder contained in the second insulating sheets 12a-(1) and 12b-(2). This makes it possible to increase the temperature difference between $T_2$ and $T_3$, i.e., $T_2$-$T_3$, and thereby fabricate a desired laminated body with stability.

Moreover, $B_3/B_2$ is preferably 0.90 or above, especially 0.95 or above, in which $B_3$ represents a volume content of the metal compound contained in the conductor green sheet. This makes it possible to increase the temperature difference between $T_2$ and $T_4$, i.e., $T_2$-$T_4$, and thereby fabricate a desired laminated body with stability.

Further, in the firing profile for firing the laminated body, by setting the temperature rising speed at 15° C./min or below, futher, 10° C./min or below, especially 6° C./min or below in the range of $T_1$ and $T_2$, it is possible to fabricate a desired laminated body with higher stability.

Here, the method for manufacturing the multilayer wiring board of the invention will be explained concretely. At the outset, the first insulating sheet and the second insulating sheet that exhibit different firing shrinking behaviors are formed as follows. A predetermined inorganic compound, a suitable an organic binder, an organic solvent and a plasticizer, and, if necessary, a dispersant are blended, thereby forming a slurry. The slurry is molded into a tape-like component by the doctor blade method or the like technique, and the tape is cut up to obtain green sheets of predetermined dimension.

At this time, in order for the firing shrinking ending temperature $T_3$ of the first insulating sheet to be lower than the firing shrinking starting temperature $T_2$ of the second insulating sheet, the ratio $B_1/B_2$ ($B_1$ represents the volume content of the inorganic compound contained in the first insulating sheet; and $B_2$ represents the volume content of the inorganic compound contained in the second insulating sheet) is set at 0.90 or above. Such first and second insulating sheets cannot be obtained without determining the composition of the slurry (selection of the functional group of the binder, selection of the dispersant, and determination of the addition amount thereof) or kneading conditions in an appropriate manner.

Next, the conductor green sheet C is formed as follows. The first and second insulating sheets are subjected to punching or the like process to create through holes in which a conductor paste is charged. Then, a surface conductor layer, an inner conductor layer, and an electrode conductor layer are formed by deposition, with use of a predetermined conductor material in paste form, by means of screen printing or the like method, and the conductor green sheet C is formed.

At this time, in order for the firing shrinking ending temperature $T_4$ of the conductor green sheet C to be lower than the firing shrinking starting temperature $T_2$ of the second insulating sheet, the $B_3/B_2$ ratio ($B_3$ represents the volume content of the metal compound contained in the conductor green sheet C; and $B_2$ represents the volume content of the inorganic compound contained in the second insulating sheet) is set at 0.90 or above. Such a conductor green sheet C cannot be obtained without determining the composition of the slurry for forming the conductor green sheet C (selection of the binder, selection of the dispersant, and determination of the addition amount thereof) or kneading conditions in an appropriate manner.

The first and second insulating sheets thus obtained are stacked on top of one another in accordance with a predetermined lamination order, thereby forming a laminated body. The laminated body is subjected to firing afterwards.

In a firing process, at first, when the firing temperature reaches the shrinking starting temperature $T_1$ of the first insulating sheet, the laminated body is fired to shrink at a temperature rising speed of 15° C./min or below, furthermore, 10° C./min or below, especially 6° C./min or below. At this time, the second insulating sheet is still kept in a non-shrinking state and thus acts to inhibit the first insulating sheet and the conductor green sheet C from shrinking in the plane direction (X-Y direction), whereby the firing shrinking thereof is so controlled that it occurs only in the thickness direction (Z direction). When the firing temperature further rises and reaches the shrinking starting temperature $T_2$ of the second insulating sheet, the first insulating sheet and the conductor green sheet C in which this firing shrinking has been nearly over in turn act to inhibit the second insulating sheet from shrinking in the X-Y direction, whereby the firing shrinking thereof is so controlled that it occurs only in the Z direction. After all, in the course of firing, all of the first insulating sheet, the second insulating sheet, and the conductor green sheet C are inhibited from shrinking in the X-Y direction and are thus caused to shrink only in the Z direction. In consequence, a resulting circuit board suffers little from warpage.

Moreover, in the invention, it is desirable to ensure that the difference in temperature between the top surface and the back surface of the laminated body is kept slight in the course of firing. Specifically, it will be effective to reduce the contact area between the laminated body and a firing setter. To that end, the firing setter may be formed of a sintered porous body having a porosity e.g. of 30% or above, or through holes or grooves may be drilled in the firing setter.

In general, in the laminated body, the back surface making contact with a firing jig such as a firing setter tends to be lower in temperature than the top surface. It occurred actually that, as compared with the first and second insulating sheets and the conductor green sheet C located near the top surface of the laminated body, those contacted by a firing setter slowed to sinter, thus delaying the time which they take to be fired completely. In consequence, the laminated body suffered from appreciable warpage. In order to overcome this problem, the laminated body-firing setter contact condition and the way of firing-setter setting need to be determined in an appropriate manner. By doing so, the difference in temperature between the top surface and the back surface of the laminated body can be kept slight in the course of firing, wherefore a circuit board with little warpage can be produced.

EXAMPLES

Example 1

Referring to Table 1, glass powder and ceramic powder serving as filler were mixed together at the mixing ratio shown in Table 1. Then, ethylcellulose (organic binder) and 2-2-4 trimethyl pentadiol monoisobutyrate (organic solvent) are blended into the powder admixture to form a slurry. The slurry was molded into a thin-layer component by the doctor blade method to obtain green sheets. Whereupon, the insulating sheets for constituting a multilayer insulating substrate were prepared for use (sheets A through H). Note that the crystallization temperature Tc of the glass and the softening point Tg of the glass were determined, by means of DTA (Differential Thermal Analysis), in accordance with a curve obtained with a temperature rising speed kept at 10° C./min.

Also listed in Table 1 are the firing shrinking starting temperatures, shrinking ending temperatures, thermal expansion coefficients, and dielectric constants of the individual insulating sheets. In carrying out data measurement, the powder admixtures for forming the individual insulating sheets were each added with wax, and then pressed at a pressure of 100 MPa to form pressed powder bodies. Subsequently, the pressed powder bodies were subjected to TMA (Thermo Mechanical Analysis) in the air at temperatures falling in a range from an ambient temperature to 1000° C., thereby measuring the shrinking starting temperatures S, the shrinking ending temperatures E, and the thermal expansion coefficients (as observed in a range of from an ambient temperature to 900° C.) of the individual ceramics bodies.

Then, a through hole was drilled by punching or the like process at a predetermined position of the corresponding insulating sheet, in which the conductor paste containing Ag powder as shown in Table 2 is charged. Moreover, the conductor paste was screen-printed on to the surface of the corresponding insulating sheet to create a predetermined wiring pattern, followed by effecting a drying treatment. Whereupon, the first and second insulating sheets were prepared for use.

In other words, the uppermost green sheet and the lowermost green sheet are defined as the first insulating sheet. The other green sheets sandwiched therebetween are defined as the second insulating sheet. In this regard, the crystallizable glass as shown in Table 2 was respectively selected so that these insulating sheets are stacked so as to constitute the laminated body shown in FIG. 1. The laminated body was thus formed. Note that the difference between the crystallization temperature Tc of the glass contained in the first insulating layer and the softening point Tg of the glass contained in the second insulating layer is listed in Table 2.

The laminated body was heated in the surrounding atmosphere, and then subjected to a binder removal treatment at 400° C. Then, the temperature was risen to 910° C. Under this condition, a multilayer wiring board having the layer arrangement shown in FIG. 1 was constructed. Note that the insulating layers 1a through 1g have a thickness of 0.1 mm, and the multilayer wiring board has a size of 10 by 10 mm, with a thickness of 1.0 mm.

Next, the plane direction (X-Y direction)-wise shrinking of the multilayer wiring board was measured in the following manner. Namely, the distance (length) between predetermined points of the laminated body in an unfired state and the distance (length) between predetermined points of the multilayer wiring board in an already-fired state were measured for comparison. Note that 10 pieces of samples were fabricated for measurement, which are numbered 1 to 10. The samples were subjected to measurement on an individual basis to obtain the mean value of all the shrinkage data, which is regarded as the shrinkage of the multilayer board. Moreover, in the 10 samples, the difference between the maximum shrinkage value and the minimum shrinkage value was evaluated as shrinkage variations.

Further, the presence or absence of cracks and delamination was examined for defect evaluation by observing the polished surface of the multilayer wiring board with use of an optical microscope.

Note that the crystallization temperature $T_c$ of the crystallizable glass contained in the first insulating layer and the softening point temperature $T_g$ of the crystallizable glass contained in the second insulating layer were determined, by means of DTA (Differential Thermal Analysis), in accordance with a curve obtained with a temperature rising speed kept at 10° C./min.

TABLE 1

| SHEET NO. | INSULATING LAYER | GLASS POWDER CRYSTALLIZATION TEMP. ° C. | SOFTENING POINT ° C. | PRECIPITATED CRYSTAL | CONTENT mass % | FILLER KIND | CONTENT mass % |
|---|---|---|---|---|---|---|---|
| A | FIRST | 785 | 640 | C, F | 70 | $Al_2O_3$ | 30 |
| B | FIRST | 790 | 644 | C, M, W | 60 | $Al_2O_3$ | 40 |
| C | FIRST | 810 | 660 | C, CJ | 50 | $Al_2O_3$ | 50 |
| D | FIRST | 790 | 650 | C, F, G | 30 | $Al_2O_3$ | 70 |
| E | FIRST | 780 | 639 | C, F | 25 | $Al_2O_3$ | 75 |
| F | SECOND | 880 | 799 | D, H | 60 | $Al_2O_3$ | 40 |
| G | SECOND | 882 | 800 | D, W, A | 60 | $Al_2O_3$ | 40 |
| H | SECOND | 885 | 805 | D, S, M | 60 | $Al_2O_3$ | 40 |

| SHEET NO. | SHRINKING STARTING TEMP. ° C. | SHRINKING ENDING TEMP. ° C. | DIELECTRIC CONSTANT 2 GHz | THERMAL EXPANSION COEFFICIENT $10^{-6}$/° C. |
|---|---|---|---|---|
| A | 650 | 740 | 7.6 | 10.0 |
| B | 656 | 744 | 8.1 | 9.7 |
| C | 650 | 740 | 8.9 | 11.1 |
| D | 648 | 740 | 9.1 | 9.8 |
| E | 640 | 733 | 9.5 | 9.5 |
| F | 740 | 850 | 9.1 | 8.5 |
| G | 758 | 860 | 9.4 | 8.6 |
| H | 737 | 840 | 9.4 | 8.7 |

ABBREVIATION SYMBOLS
(C: CELSIAN; F: FORSTERITE; M: MULLITE; W: WILLEMITE; CJ: CORDIERITE; G: GAHNITE; D: DIOPSIDE; H: HARDESTNITE; A: ANORTHITE; S: SPINEL)

TABLE 2

| SAMPLE NO. | FIRST INSULATING LAYER SHEET NO. | Tc ° C. | SECOND INSULATING LAYER SHEET NO. | Tg ° C. | TEMPERATURE DIFFERENCE Tg − Tc ° C. | CO-FIRED SUBSTRATE SHRINKAGE % | SHRINKAGE VARIATIONS % | DEFECT |
|---|---|---|---|---|---|---|---|---|
| 1 | A | 785 | F | 799 | 14 | 2.5 | 0.3 | ABSENT |
| 2 | A | 785 | F | 799 | 14 | 2.5 | 0.3 | ABSENT |
| 3 | B | 790 | F | 799 | 9 | 3.5 | 0.3 | ABSENT |
| 4 | B | 790 | G | 800 | 10 | 3 | 0.3 | ABSENT |
| *5 | C | 810 | G | 800 | −10 | 10 | 0.7 | GENERATED |
| *6 | C | 810 | H | 805 | −5 | 8.5 | 0.7 | ABSENT |
| 7 | D | 790 | G | 800 | 10 | 2.5 | 0.3 | ABSENT |
| 8 | D | 790 | H | 805 | 15 | 2 | 0.3 | ABSENT |

TABLE 2-continued

| | FIRST INSULATING LAYER | | SECOND INSULATING LAYER | | TEMPERATURE DIFFERENCE | CO-FIRED SUBSTRATE | | |
|---|---|---|---|---|---|---|---|---|
| SAMPLE NO. | SHEET NO. | Tc °C. | SHEET NO. | Tg °C. | Tg − Tc °C. | SHRINKAGE % | SHRINKAGE VARIATIONS % | DEFECT |
| 9 | D | 790 | H | 805 | 15 | 1.5 | 0.3 | ABSENT |
| 10 | E | 780 | H | 805 | 25 | 0.5 | 0.2 | ABSENT |

Astarisk* represents a sample constituting a departure from the scope of the invention.

As will be seen from the tables, in the samples Nos. 1 to 4 and 7 to 10 of the multilayer wiring board of the invention, the shrinkage is below 4%, and shrinkage variations are equal to 0.3% or below. Moreover, neither crack nor delamination was observed therein. It has thus been confirmed that the multilayer wiring board of the invention is excellent in characteristics, namely the dimensional accuracy is high, the plane direction-wise shrinkage is reduced to practically zero, shrinkage variations are decreased, and the conductor resistance is low.

On the other hand, in the samples Nos. 5 and 6 that constitute a departure from the scope of the invention, since the crystallization temperature of the crystallizable glass contained in the first insulating layer is higher than the softening point of the crystallizable glass contained in the second insulating layer, it follows that the shrinkage and shrinkage variations were found to be as high as 8.5% or above and 0.7% or above, respectively.

Example 2

The same as the case of Example 1, green sheets as shown in Table 1 were fabricated. Whereupon, the insulating sheets for constituting a multilayer insulating substrate were prepared for use (sheets A through H).

Next, Ag powder composed of Ag particles of varying grain sizes was subjected to e.g. a ball-mill mixing process to form Ag powder materials of varying tap bulk densities. Then, an organic binder (ethylcellulose) and an organic solvent (2-2-4 trimethyl pentadiol monoisobutyrate) were blended into the Ag powder to form a conductor paste having an Ag powder content of 84% by mass. The grain size and density ratio of the Ag powder used to prepare the conductor paste are listed in Table 2. Note that the density ratio was obtained by calculation, on the basis of the tap bulk density measured in accordance with the density measurement method prescribed in JIS R1628 and the density ($d^{20}$) of Ag taken from the Metal Data Book compiled by The Japan Institute Of Metals, using the following expression:

Density ratio=(tap bulk density of metal powder/density of metal element)×100(%).

Then, a through hole was drilled by punching or the like process at a predetermined position of the corresponding insulating sheet, in which the conductor paste as shown in Table 3 is charged. Moreover, the conductor paste was screen-printed on to the surface of the corresponding insulating sheet to create a predetermined wiring pattern, followed by effecting a drying treatment. Whereupon, the first and second insulating sheets were prepared for use. These insulating sheets thus obtained were subjected to compression bonding to form a laminated body.

In regard to the layer arrangement of the laminated body, as shown in FIG. 1, the uppermost green sheet and the lowermost green sheet are defined as the first insulating sheet. The other green sheets sandwiched therebetween are defined as the second insulating sheet. Note that the difference between the crystallization temperature Tc of the glass contained in the first insulating layer and the softening point Tg of the glass contained in the second insulating layer is listed in Table 3.

The laminated body was heated in the surrounding atmosphere, and then subjected to a binder removal treatment at 400° C. Then, the temperature was risen to 910° C. Under this condition, co-firing was performed thereon for 1 hour, whereupon a multilayer wiring board having the layer arrangement shown in FIG. 1 was constructed (test samples Nos. 1 to 12). In the multilayer wiring board samples, the insulating layers 1a through 1g have a thickness of 0.1 mm, and the multilayer wiring board has a size of 50 by 40 mm, with a thickness of 0.7 mm.

In each of the multilayer wiring boards thus constructed, the ratio of void in the cross section of the wiring layer and the sheet resistance were measured. The measurement results are listed in Table 3.

The sheet resistance was measured with use of a resistance meter. The values listed in Table 3 were obtained under the condition that the conductor thickness t=20 μm.

The void ratio was measured by performing SEM observation on the (mirror-) polished surface of the cross section, using the following expression:

(void area in wiring layer/wiring layer area)×100(%).

Note that, assuming that the void ratio in the cross section is X% and the void ratio in the bulk is Y%, then the relationship between X and Y is given by: $Y=X^{3/2}$.

Next, the plane (X-Y) direction-wise shrinkage of the multilayer wiring board was measured in the following manner. Namely, the distance (length) between predetermined points of the laminated body in an unfired state and the distance (length) between predetermined points of the wiring board in an already-fired state were measured for comparison. With the measurement values, the shrinkage was calculated in the following expression:

shrinkage: ((a−b)/a)×100(%)

wherein a represents before-firing length and b represents after-firing length. Moreover, shrinkage variations were also measured, and the measurement results are listed in Table 3. Note that 10 pieces of samples were fabricated for measurement, which are numbered 1 to 10. The samples were subjected to measurement on an individual basis to obtain the mean value of all the shrinkage data, which is regarded as the shrinkage of the wiring board. In addition, in the 10 samples, the difference between the maximum shrinkage value and the minimum shrinkage value was evaluated as shrinkage variations.

Further, the presence or absence of cracks and delamination was examined for defect evaluation by observing the polished surface of the multilayer wiring board with use of an optical microscope.

TABLE 3

| SAMPLE NO. | FIRST INSULATING LAYER | | SECOND INSULATING LAYER | | TEMPERATURE DIFFERENCE |
|---|---|---|---|---|---|
| | SHEET NO. | Tc °C. | SHEET NO. | Tg °C. | Tg − Tc °C. |
| 11 | A | 785 | F | 799 | 14 |
| 12 | A | 785 | F | 799 | 14 |
| 13 | B | 790 | F | 799 | 9 |
| 14 | B | 790 | G | 800 | 10 |
| 15 | D | 790 | G | 800 | 10 |
| 16 | D | 790 | H | 805 | 15 |
| 17 | D | 790 | H | 805 | 15 |
| 18 | E | 780 | H | 805 | 25 |
| 19 | D | 790 | G | 800 | 10 |
| 20 | D | 790 | G | 800 | 10 |
| *21 | B | 790 | F | 799 | 9 |
| *22 | B | 790 | G | 800 | 10 |

| SAMPLE NO. | WIRING LAYER (Ag) | | | | CO-FIRED SUBSTRATE | | |
|---|---|---|---|---|---|---|---|
| | GRAIN SIZE μm | DENSITY RATIO 1) % | VOIDAGE % | SHEET RESISTANCE mΩ/square | SHRINKAGE % | SHRINKAGE VARIATIONS % | DEFECT |
| 11 | 1 | 20 | 3 | 1.4 | 2.5 | 0.3 | ABSENT |
| 12 | 1 | 20 | 3 | 1.4 | 2.5 | 0.3 | ABSENT |
| 13 | 1 | 20 | 3 | 1.4 | 3.5 | 0.3 | ABSENT |
| 14 | 1 | 20 | 3 | 1.4 | 3 | 0.3 | ABSENT |
| 15 | 1 | 35 | 2 | 1.4 | 2.5 | 0.3 | ABSENT |
| 16 | 1 | 35 | 2 | 1.4 | 2 | 0.3 | ABSENT |
| 17 | 1 | 35 | 2 | 1.4 | 1.5 | 0.3 | ABSENT |
| 18 | 1 | 35 | 2 | 1.4 | 0.5 | 0.2 | ABSENT |
| 19 | 1 | 15 | 4 | 1.4 | 2 | 0.3 | ABSENT |
| 20 | 1 | 15 | 4 | 1.4 | 2 | 0.3 | ABSENT |
| *21 | 3 | 12 | 7 | 1.6 | 3.5 | 0.3 | ABSENT |
| *22 | 3 | 10 | 10 | 1.7 | 3 | 0.3 | ABSENT |

Asterisk* represents a sample constituting a departure from the scope of the invention.
1) Density ratio = (tap bulk density of metal powder/density of metal element) × 100

As will be seen from the tables, in the samples Nos. 11 to 20 of the multilayer wiring board of the invention, the shrinkage is below 4%, shrinkage variations are equal to 0.3% or below, and the sheet resistance is below 1.5 mΩ/square. Moreover, neither crack nor delamination was observed therein. It has thus been confirmed that the multilayer wiring board of the invention is excellent in characteristics, namely the dimensional accuracy is high, the plane direction-wise shrinkage is reduced to practically zero, shrinkage variations are decreased, and the conductor resistance is low.

On the other hand, in the samples Nos. 21 and 22 constituting a departure from the scope of the invention in which the void ratio in the wiring layer exceeds 5%, the sheet resistance takes on a value as high as 1.6 mΩ/square or above.

Example 3

A multilayer wiring board having such a constitution as shown in FIG. 2 was fabricated in the following manner. At the outset, two different ceramic materials a and b were prepared for use. The ceramic material a consists of 80% by weight of $SiO_2$—$Al_2O_3$—$MgO$—$CaO$—$B_2O_3$—$ZnO$—$TiO_2$—$Na_2O$—$Li_2O$ glass powder and 20% by weight of $Al_2O_3$ powder having an average particle diameter of approximately 1 μm. The ceramic material B consists of 60% by weight of $SiO_2$—$Al_2O_3$—$MgO$—$CaO$—$BaO$—$SrO$—$B_2O_3$ glass powder and 40% by weight of $Al_2O_3$ powder having an average particle diameter of approximately 1 μm. Then, suitable binder and dispersant were kneadingly blended into each of the ceramic materials A and b to form a slurry. The slurry was processed into first and second insulating sheets by the doctor blade method, whereupon ceramic green sheets having different inorganic-compound volume content as shown in Table 4 were obtained.

The lamination order of the ceramic green sheets conforms to that shown in FIG. 2. Next, a through hole was drilled in each of the green sheets, in which a conductor paste containing Ag powder is charged. Then, a surface conductor layer, an inner conductor layer, and a back-surface conductor layer were printed on to the corresponding surfaces of the ceramic green sheets with use of a conductor paste. As the main conductor material of the surface conductor layer, the inner conductor layer, and the back-surface conductor layer, silver powder was used. Suitable organic vehicle and surface-active agent were blended into the silver powder, and the admixture was kneaded by a three-roll mill until the agglomeration of the silver powder particles was eliminated, thereby forming the conductor paste. In this way, conductor green sheets having different metal-compound volume content as shown in Table 4 were obtained.

After undergoing positional alignment, the green sheets were stacked together to form a laminated body. The laminated body was subjected to a binder removal treatment at 400° C. in the surrounding atmosphere, and was thereafter heated at 910° C. in the surrounding atmosphere, whereupon the multilayer wiring board was fabricated.

As the firing setter, a porous material composed predominantly of $Al_2O_3$—$SiO_2$ was used. At this time, several types of firing setters were prepared for use: the one having a thickness of 3 mm with a through hole of approximately 1 mm in diameter; the one having a thickness of 3 mm without through hole; and the one having a thickness of 1 mm without through hole. Moreover, a spacer was disposed between the bottom surface of the firing setter and a firing furnace to change the way of firing-setter setting, so that the firing setter may be heated from its bottom surface side.

Here, the thicknesses of the first and second insulating sheets were set at 50 μm and 100 μm, respectively. In order to determine the volume content of the inorganic compound in each of the green sheets, at first, the density of the raw green sheet (g/cm³) was measured. Then, calculation is made on the basis of the measured value, the density of the inorganic compound, the density of the additive contained in the slurry, and the composition of the green sheet in itself.

In order to examine the firing shrinking behaviors of the first insulating sheet, the seond insulating sheet, and the conductor green sheet c, predetermined holes were drilled in the individual green sheets for dimension evaluation. Then, in the course of firing, the green sheets were taken out from the firing furnace to check the interval between the holes. On the basis of the dimensional change, the shrinkage of each of the green sheets was calculated, whereby the shrinking starting and ending temperatures were determined. For measurement was used the conductor green sheet C having a thickness of 100 μm which was obtained by a plural repetition of printing and drying of the conductor paste.

A multilayer wiring board sample in finished form (according to the multilayer wiring board as shown in FIG. 2) was subjected to plane direction-wise warpage evaluation. Specifically, irregularities existing near the 7 mm square electrode of the surface layer conductor were measured by using a three dimensional measuring machine. Then, the difference between the maximum asperity value and the minimum asperity value was determined as a warpage. The measurement results are listed in Table 4.

TABLE 4

| SAMPLE NO. | INORGANIC COMPOUND VOLUME CONTENT IN GREEN SHEET (vol %) | | | | | FIRING PROFILE TEMPERATURE RISING SPEED (° C./MIN) | FIRING SETTER |
|---|---|---|---|---|---|---|---|
| | FIRST INSULATING SHEET $B_1$ | SECOND INSULATING SHEET $B_2$ | CONDUCTOR LAYER $B_3$ | $B_1/B_2$ | $B_3/B_2$ | | |
| *23 | 45 | 52 | 42 | 0.87 | 0.81 | 10 | 3 mm/WITHOUT HOLE |
| *24 | 47 | 52 | 42 | 0.90 | 0.81 | 10 | 3 mm/WITHOUT HOLE |
| 25 | 49 | 52 | 47 | 0.94 | 0.90 | 10 | 3 mm/WITHOUT HOLE |
| 26 | 56 | 52 | 47 | 1.08 | 0.90 | 10 | 3 mm/WITHOUT HOLE |
| 27 | 51 | 52 | 50 | 0.98 | 0.96 | 10 | 3 mm/WITHOUT HOLE |
| 28 | 51 | 48 | 54 | 1.06 | 1.13 | 10 | 3 mm/WITHOUT HOLE |
| 29 | 52 | 57 | 52 | 0.91 | 0.91 | 15 | 3 mm/WITHOUT HOLE |
| 30 | 52 | 57 | 52 | 0.91 | 0.91 | 6 | 3 mm/WITHOUT HOLE |
| 31 | 51 | 52 | 50 | 0.98 | 0.96 | 10 | 1 mm/WITHOUT HOLE |
| 32 | 51 | 52 | 50 | 0.98 | 0.96 | 10 | 3 mm/WITH HOLE |
| 33 | 51 | 52 | 50 | 0.98 | 0.96 | 10 | 3 mm/WITH SPACER |

| SAMPLE NO. | FIRST INSULATING SHEET SHRINKING STARTING TEMP. $T_1$(° C.) | FIRST INSULATING SHEET SHRINKING ENDING TEMP. $T_3$(° C.) | SECOND INSULATING SHEET SHRINKING STARTING TEMP. $T_2$(° C.) | CONDUCTOR LAYER SHRINKING ENDING TEMP. $T_4$(° C.) | RELATION WITH $T_2$ $T_3 - T_2$ ° C. | RELATION WITH $T_2$ $T_4 - T_2$ ° C. | WARPAGE μm |
|---|---|---|---|---|---|---|---|
| *23 | 660 | 755 | 745 | 780 | −10 | −35 | 75 |
| *24 | 640 | 730 | 745 | 780 | 15 | −35 | 53 |
| 25 | 630 | 720 | 745 | 740 | 25 | 5 | 24 |
| 26 | 600 | 710 | 745 | 740 | 35 | 5 | 26 |
| 27 | 620 | 720 | 745 | 720 | 25 | 25 | 20 |
| 28 | 620 | 720 | 755 | 715 | 35 | 40 | 18 |
| 29 | 620 | 725 | 732 | 730 | 7 | 2 | 34 |
| 30 | 620 | 710 | 725 | 710 | 15 | 15 | 22 |
| 31 | 620 | 720 | 745 | 720 | 25 | 25 | 10 |
| 32 | 620 | 720 | 745 | 720 | 25 | 25 | 9 |
| 33 | 620 | 720 | 745 | 720 | 25 | 25 | 12 |

As will be understood from Table 4, the following facts have been confirmed. In the samples Nos. 25 to 33 embodying the invention that exhibit a $B_1/B_2$ ratio of 0.90 or above and a $B_3/B_2$ ratio of 0.90 or above, and also fulfill the condition of $T_3<T_2$, $T_4<T_2$, the degree of warpage is less than 35 μm. By way of contrast, in the samples Nos. 23 and 24 constituting a departure from the scope of the invention that exhibit a $B_1/B_2$ ratio of 0.90 or below and a $B_3/B_2$ ratio of less than 0.90, and also fulfill the condition of $T_3>T_2$, $T_4>T_2$, the degree of warpage exceeds 50 μm, which is larger than the degree of warpage in the case of those embodying the invention. Moreover, in performing firing, by setting the temperature rising speed at 10° C./min. or below in the range of from $T_1$ to $T_2$, it is possible to increase the difference in temperature between $T_2$ and $T_3$, as well as $T_2$ and $T_4$, and thereby decrease the degree of warpage. Further, the difference in temperature between the top surface and the back surface of the sample can be kept slight by making the firing setter smaller in thickness, by drilling a through hole therein, or by providing a spacer, wherefore the degree of warpage can be decreased.

The invention may be embodied in other specific forms without departing from the sprit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

What is claimed is:

1. An insulating substrate comprising:
   a laminated body including at least two kinds of glass-ceramics insulating layers,
   wherein crystallizable glass contained in a first insulating layer of the at least two kinds of glass-ceramics insulating layers and crystallizable glass contained in a second insulating layer thereof are different from each other, and
   a crystallization temperature of the crystallizable glass contained in the first insulating layer is higher than a softening point of the crystallizable glass contained in the first insulating layer, and a crystallization temperature of the crystallizable glass contained in the second insulating layer is higher than a softening point of the crystallizable glass contained in the second insulating layer,
   wherein the crystallization temperature of the crystallizable glass contained in the first insulating layer is lower than the softening point of the crystallizable glass contained in the second insulating layer, and
   wherein the first insulating layer contains celsian and further contains a plurality of different kinds of crystals selected from the group consisting of forsterite, mullite, willemite, cordierite, and gahnite, wherein the first insulating layer does not contain diopside; the second insulating layer contains diopside and further contains a plurality of different kinds of crystals selected from the group consisting of forsterite, hardestnite, willemite, spinel, and anorthite, wherein the second insulating layer does not contain celsian.

2. The insulating substrate of claim 1, wherein a difference in thermal expansion coefficient between the first insulating layer and the second insulating layer is given by: $2\times10^{-6}/°$ C. or below.

3. The insulating substrate of claim 1, wherein the first and the second insulating layers each have a crystallizable glass content of 30% by mass or above.

4. The insulating substrate of claim 1, wherein the first and second insulating layers each have a residual glass content of 10% by volume or below.

5. The insulating substrate of claim 1, wherein a difference in crystallization temperature between the crystallizable glass contained in the first insulating layer and the crystallizable glass contained in the second insulating layer is 90° C. or higher.

6. The insulating substrate of claim 1, wherein a difference in softening point between the crystallizable glass contained in the first insulating layer and the crystallizable glass contained in the second insulating layer is 150° C. or higher.

7. A multilayer wiring board comprising:
   the insulating substrate of claim 1; and
   wiring layers formed on surfaces of the insulating substrate and in an interior of the insulating substrate,
   wherein the insulating substrate and the wiring layers are formed by co-firing,
   and wherein the wiring layer has a cross section whose void ratio is reduced to 5% or below.

8. The multilayer wiring board of claim 7, wherein the wiring layer predominantly contains at least one selected from the group consisting of Au, Ag, Cu, Pd, and Pt.

* * * * *